United States Patent [19]

Calvignac et al.

[11] Patent Number: 5,046,069
[45] Date of Patent: Sep. 3, 1991

[54] DATA INTEGRITY SECURING MEANS

[75] Inventors: Jean Calvignac, LaGaude; Michel Dauphin; Raymond Lenoir, both of Vence; Jean-Louis Picard, LaColle sur Loup, all of France

[73] Assignee: International Business Machines Corporation, Armonk, N.Y.

[21] Appl. No.: 259,025

[22] Filed: Oct. 17, 1988

[30] Foreign Application Priority Data

Oct. 30, 1987 [EP] European Pat. Off. ........ 87480017.0

[51] Int. Cl.$^5$ ............................................ H03M 13/00
[52] U.S. Cl. ........................................ 371/53; 371/37.1
[58] Field of Search ................. 370/85.13, 85.14, 94, 370/99; 371/37.1, 53

[56] References Cited

U.S. PATENT DOCUMENTS 4,723,244 2/1988 Iacoponi .......................... 371/37.1

FOREIGN PATENT DOCUMENTS

WOA8002611 11/1980 PCT Int'l Appl. .

OTHER PUBLICATIONS

Madron, T., *Local Area Networks-The Second Generation*, John Wiley & Sons, 1988, pp. 166-172.
Patent Abstracts of Japan, vol. 7, No. 288, 22nd Dec. 1983.
Eurocon 77-European Conference on Electrotechnics, 3rd-7th May 1977, pp. 1.1.7.1-1.1.7.7.
Computer Design, vol. 18, No. 2, Feb. 1979, pp. 122-125.
IEEE Journal of Solid-State Circuits, vol. SC-15, No. 1, Feb. 1980, pp. 52-60.
IEEE Transactions on Power Apparatus and Systems, vol. PAS-103, No. 8, Aug. 1984, pp. 2058-2064.

*Primary Examiner*—Stephen M. Baker
*Attorney, Agent, or Firm*—Joscelyn G. Cockburn

[57] ABSTRACT

A process for updating the frame check sequence $FCS_f(X)$ of a digital frame including an embedded variable header polynomial $H_r(x)$, said process including: partitioning $H_r(x)$; XORing the modified polynomial header $H_r(x)$ and previous polynomial header $H_r(x)$ to generate a differential polynomial $D(x)$; computing a differential frame check polynomial sequence dFCS (x) on said D(x) only and adding dFCS (x) to the polynomial $FCS_f(x)$ to form a new $FCS_f(x)$.

7 Claims, 6 Drawing Sheets

DATA INTEGRITY SECURING MEANS

FIELD OF INVENTION

This invention deals with data communication networks and more particularly with data integrity securing means within said networks.

BACKGROUND OF INVENTION

Data integrity is a major concern in Communication Networks in which data sent from an originating source terminal to a destination terminal may flow through a network including several intermediate nodes, over paths including several physical links. Data integrity is secured on links from node to node by means of a frame check sequence (FCS). This checking sequence is generated at the transmitting site to be data dependent according to a predetermined relationship. The generated transmission FCS (i.e. $FCS_t$ with t standing for transmit) is appended to the transmitted data. Data integrity at the receiving terminal is then checked by deriving from the received data a receive frame check sequence ($FCS_r$ with r standing for receive) and comparing $FCS_r$ to $FCS_t$ to check for identity or processing complete frames using a process similar to the one generating the $FCS_t$ and comparing the result to a predetermined value for identity. Any invalid detection leads to a mere discard of the received data frame and the initiation of a procedure established to generate retransmission of same data frame until validity is checked.

FCS generation is performed through a complex processing operation involving polynomial divisions performed on all the data contained in a frame. These operations are high computing power consumers adding to the transmission system processing load. Any method for simplifying the FCS generation process would be welcome by the transmission industry.

Also, in a number of applications, the transmitted message frame includes information data, and a so-called header made to help the transmitted frame find its way from node to node, within the network, up to the destination terminal. This routing data is modified in each node for instance by inserting in the message to be forwarded the address of subsequent node in the network. All these operations do therefore affect the message frame and thus, the FCS needs to be regenerated in each node. This means that the FCS generation process needs to be implemented several times on each message flowing in the transmission network which emphasizes the above comments on usefulness of simplified FCS generation schemes.

Finally, in some applications, like in communications controllers for instance, the received message is assembled bit by bit, and stored for a while in an intermediate node Communication Controller prior to it being forwarded to next node (e.g. next controller) and so on up to the destination terminal. Conventional Communication Controllers after checking the received frame validity, drop the received $FCS_r$ in the process, and store the information data. Then, when data are to be transmitted further, a new FCS, i.e. $FCS_t$, is generated to be appended with the data. Should any alteration had affected the data during its storage, it would not be noticed by the destination terminal or node since the new FCS generated would have been computed on the altered data.

One object of this invention is to provide an FCS generation method that minimizes the computing load required to regenerate FCS associated to a given data frame, e.g. regenerate FCS in intermediate Communication nodes, and in addition provide data integrity checking means.

Another object of this invention is to provide a method for checking the integrity of data stored in an intermediate transmission node or Communication Controller in a data transmission network prior to said data being retransmitted.

This and other objects, characteristics and advantages of the present invention will be explained in the following, with reference to the attached drawings.

DESCRIPTION OF PREFERRED EMBODIMENT

Figure 1:
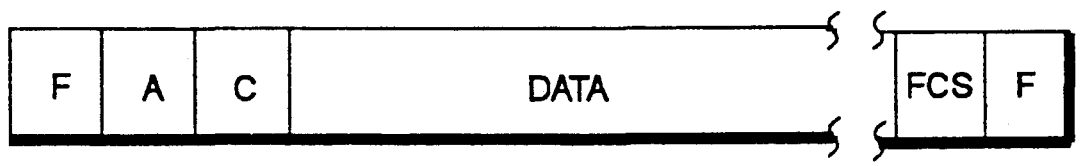
FIG. 1 shows the structure of an SDLC/HDLC frame.

Represented in FIG. 1 is an SDLC frame including several fields respectively designated by F, A, C, Data, FCS and F.

The F fields are used for frame delimiters conventionally made to include flags represented by an hexadecimal "7E" byte.

A is an address field that identifies the station that is sending (or is to receive) the frame.

C is a control field that specifies the purpose of the considered frame. It is usually one byte long and may be in one of three formats: unnumbered format, supervisory format or information transfer format. Unnumbered format frames are used for such functions as: initializing a destination secondary station; controlling the response mode of secondary stations; or reporting certain procedural errors. Supervisory formats are used to assist in the transfer of information in that they are used to confirm preceding frames carrying information. The frames of the supervisory format do not carry pure information themselves. These frames are used to confirm received frames, convey ready or busy conditions, and to report frame numbering errors (indicating that a numbered information frame was received out of its proper sequence). Information transfer formats are used as vehicle for information transfer in SDLC. The control field besides indicating the format, contains send and receive counts (Ns and Nr) which are used to ensure that these frames are received in their proper order (Ns) and to confirm accepted information frames (Nr). The Ns count indicates the number of the information frame within the sequence of information frames transmitted.

The information data field is a variable length (in multiples of 8-bit bytes) field made to include the information data, sometimes referred to as pure information data (I).

Following the information field is the Frame Check Sequence (FCS) field whose purpose is to enable checking the SDLC frame contents for error that may have been introduced by the communication channel or anywhere along the transmission path, e.g. in storage within intermediate node along the transfer path. This field contains a 16-bit check sequence that is the result of a computation on the contents of fields A, C and I operated before transmitting or forwarding any SDLC frame and appended to the frame.

Generally speaking what needs be understood for the present invention, is that each transmitted frame includes one portion, to be referred to as information carrying portion, which should normally not vary along the transmission path, and another portion, referred to as "Header", which varies along the path. Any variation within the information frame section would be in error and should be detectable at any checking location, using the FCS section within the frame.

It should be noted that in the following the expression "Header" will designate the varying frame portion, eventhough it may be located anywhere within the frame.

FCS generation is conventionally operated by polynomial divisions as explained hereunder.

Assuming that the frame to be transmitted, i.e. the address field A, the control field C and the (possibly empty) information data field, contain k bits and denoting these k bits by coefficients $a_{k-1}, \ldots, a_0$ defined as elements of Galois field of order 2 (GF2) each equal to zero or one, the frame may be represented by a polynomial $P_{k-1}(x)$.

$$P_{k-1}(x) = a_{k-1} \cdot x^{k-1} + x_{k-2} \cdot x^{k-2} + \ldots + a_1 x + a_0$$

The FCS conventionally involves computing remainders of polynomial divisions modulo 2 of $x^l \cdot P_k(x)$ by a so called generating polynomial G(x) of degree with being a predetermined integer value. This generating polynomial is a predefined one, selected by the CCITT for instance.

The generating polynomial as defined by CCITT is:

$$G(x) = x^{16} + x^{12} + x^5 + 1 \text{ of degree } l = 16$$

In the following, Remainder (A(x),G(x)) denotes the remainder of the polynomial division (modulo 2) of the polynomial A(x) by the polynomial G(x).

The FCS may then be considered as the sum (modulo 2) of three terms:

$$FCS(x) = T1(x) + T2(x) + F15(x)$$

wherein:

$$F15(x) = x^{15} + x^{14} + x^{13} + \ldots + x^3 + x^2 + x + 1$$

$$T1(x) = \text{Remainder } (x^k \cdot F15(x), G(x))$$

$$T2(x) = \text{Remainder } (x^{16} \cdot P_{k-1}(x), G(x))$$

This FCS(x) represents a 16-bit long sequence with higher order coefficients first, and the polynomial finally transmitted within the SDLC frame in between flags is then:

$$M(x) = x^{16} \cdot P_{k-1}(x) + FCS(x)$$

Conventionally, at the receiver, $M_r(x)$ denoting the received frame from flag to flag, the sum (modulo 2) of the following two terms is computed:

1. Remainder $(x^{k+16} \cdot F15, G(x))$ where $k+16$ is the number of bits in $M_r(x)$
2. Remainder $(x^{16} \cdot M_r(x), G(x))$ This sum yields the constant polynomial $x^{12} + x^{11} + x^8 + x^3 + x^2 + x + 1$ if and only if no detectable error has occured.

Now, let us assume $M_r(x)$ is a SDLC/HDLC frame received in a data transmission network node. It could be then expressed in the form:

$$M_r(x) = (H_r(x) + I(x)) \cdot x^{16} + FCS_r(x)$$

where:

$H_r(x)$ is the polynomial representing a modifiable variable field herein designated as header including the routing message that should normally vary from one node to another, or more generally stated, vary throughout the network.

$I_{(x)}$ is the polynomial representing the information field which is to be transmitted without any modification.

$FCS_r(x)$ is the polynomial representing the received FCS.

Upon changing the header content from $H_r(x)$ to $H_t(x)$ (t standing for transmit) for frame routing purposes in a given node, adding this new header to $I(x)$ and re-computing the correlative $FCS_t(x)$, the new frame $M_t(x)$ could be expressed by:

$$M_t(x) = (H_t(x) + I(x)) \cdot x^{16} + FCS_t(x).$$

Instead of performing the FCS evaluation of $H_t(x) + I(x)$, the invention performs the following operations:

compute a variation polynomial D(x)

$$D(x) = H_t(x) - H_r(x)$$

compute a dFCS term $$dFCS = \text{Remainder } (D(x) \cdot x^{16}, G(x)) \quad (1)$$

compute $FCS_t(x)$ $$FCS_t(x) = FCS_r(x) + dFCS$$

An advantage of the proposed method is derived from the fact that I(x) is not directly involved in the operations. Therefore, should unexpected changes have occured in that field which is assumed to remain unchanged, it can easily be detected at the transmission network receiving end.

Figure 2:
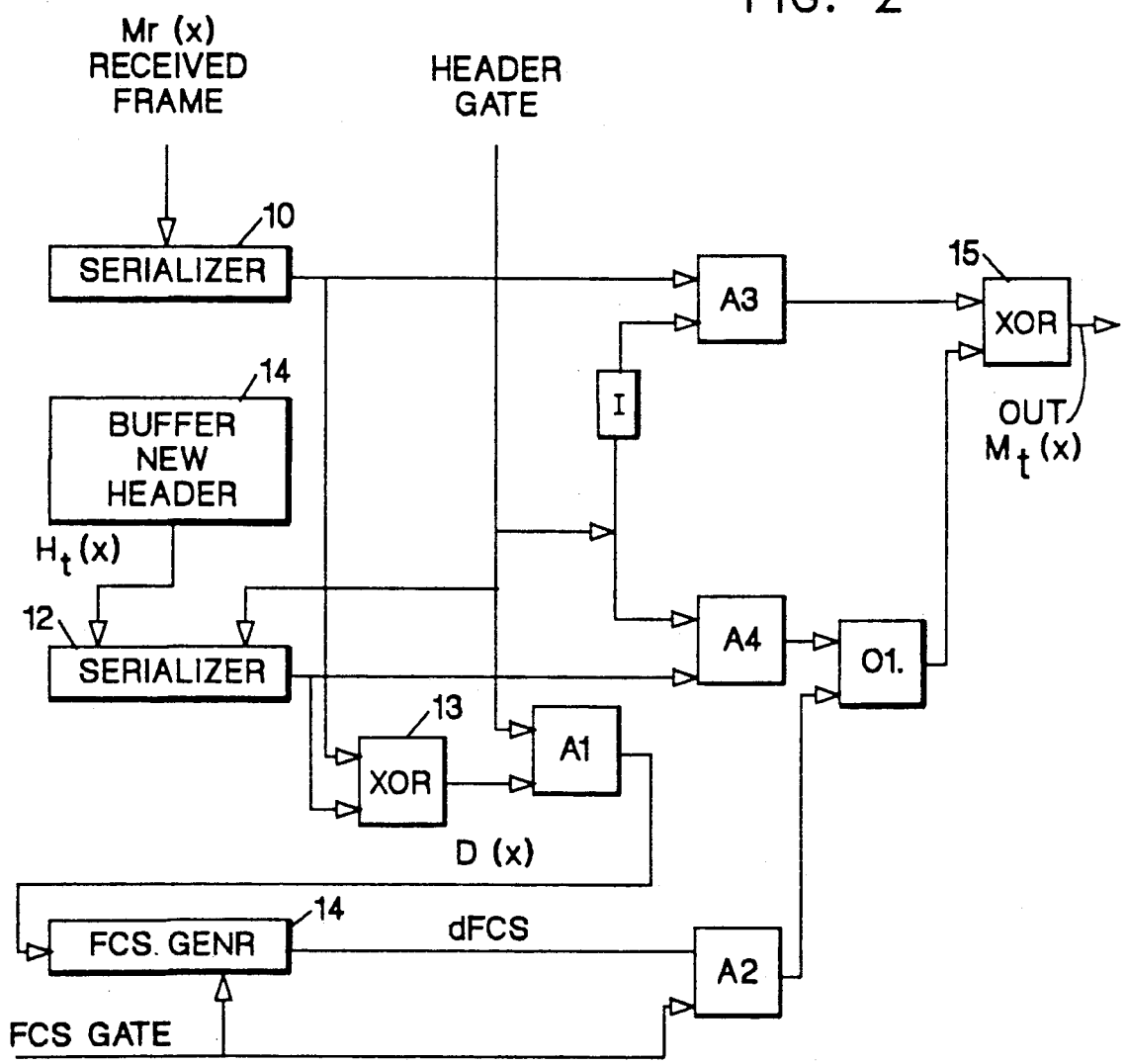
FIG. 2 is a block diagram of a device for implementing the invention.

An example of implementation of a communication adapter using a device based on the proposed method is shown in FIG. 2. It is made to update an SDLC frame i.e., update its FCS, when its header changes from $H_r(x)$ to $H_t(x)$ for routing purposes.

The logic includes two serializers. Serializer 10 is used to serialize the whole received frame $M_r(x)$ as it was received. Serializer 12 is used to serialize the new header $H_t(x)$, previously stored in a buffer register 14.

The serializers shifting operations are controlled by a clock (not represented) operating at bit rate.

A HEADER GATE logic signal is made to be up during the time the bits of $H_r(x)$ are outputted from serializer 10. This logic signal controls both the operation of serializer 12 and an AND gate A1.

Both $H_r(x)$ and $H_t(x)$ are XORed in a circuit 13 performing the above operations and deriving D(x) therefrom, since in GF2 field the subtraction and addition operations are equivalent to an Exclusive - OR (XOR) operation.

An FCS Generator 14 originally set to all zero, is used to divide the polynomial D(x) gated through A1 by a polynomial G(x) preselected, and output the Remainder dFCS. Said FCS generator is conventionally made of shift registers and XOR circuits and is well known in the art. For further details, one may refer to the document "IBM Synchronous Data Link Control General Information" GA27-3093-2.

FCS GATE signal is set on during the time corresponding to the transmission of the FCS field, which enables gating dFCS through an AND gate A2, and OR gate O1, up to an input of XOR circuit 15.

The outputs of serializers 10 and 12 are gated through gates A3 and A4 respectively, with said gating being controlled with the HEADER GATE signal either directly for A4 or through an inverter I, for A3.

The output from A4 is fed to OR circuit O1, while A3 output is applied to the second input of XOR gate 15.

The pattern computed by the FCS generator 14 is then added modulo 2 to the old FCS, in XOR 15, and inserted in the SDLC frame at proper location to get $M_t(x)$ as the circuit output.

As should be shown below, the process of this invention leads to particularly interesting implementations when taking also into account specific characteristics such as size and/or location of the varying header section, and emphasis to be given to size, speed or cost parameters. Specific examples are considered hereunder.

Figure 3A:
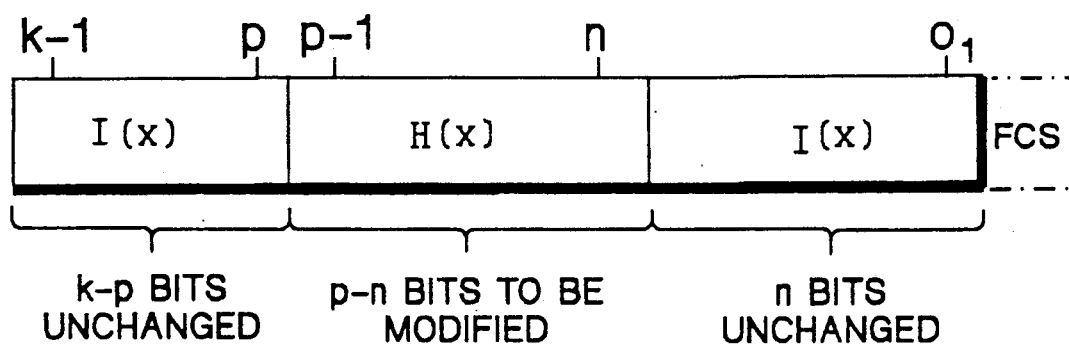
FIGS. 3a and 3b show structures of frames to be used with the invention.

Let us first assume the frame is modified between and including bit "n" and bit "p−1" ($0 < n < p < k$); that is, the lower "n" bits and the upper "k-p" bits of the frame are kept unchanged, and the "p-n" bits in the middle are modified (see FIG. 3a).

Assuming that the k bits of the frame $P_{k-1}(x)$ before modification are still represented by coefficients $a_{k-1}, \ldots, a_0$, the problem is to find the impact of this modification onto the original FCS. The frame can be represented by the sum of two polynomials, I(x) (which is kept unchanged), plus $H_r(x)$ (part to be modified):

$$P_{k-1}(x) + H_r(x), \text{ with:}$$

$$I(x) = a_{k-1} \cdot x^{k-1} + a_{k-2} \cdot x^{k-2} + \ldots + a_{p+1} \cdot x^{p+1} + a_p \cdot x^p +$$
$$a_{n-1} \cdot x^{n-1} + a_{n-2} \cdot x^{n-2} + \ldots + a_1 x + a_0$$

$$H_r(x) = a_{p-1} \cdot x^{p-1} + a_{p-2} \cdot x^{p-2} + \ldots + a_{n+1} \cdot x^{n+1} + a_n \cdot x^n$$

Let $b_{p-1}, b_{p-2}, \ldots, b_n$ denote the new bit values between bit p−1 and bit n, and let $H_t(x)$ represent the modified part of the frame:

$$H_t(x) = b_{p-1} \cdot x^{p-1} + b_{p-2} \cdot x^{p-2} + \ldots + b_n \cdot x^n$$

The modified frame $P'_{k-1}(x)$ is then represented by:

$$P'_{k-1}(x) = I(x) + H_t(x)$$

According to the result (1), the difference between the old FCS, denoted $FCS_r$, and the new FCS, denoted $FCS_t$, is then:

$$dFCS = \text{Remainder} ((H_t(x) - H_r(x)) \cdot x^{16}, G(x))$$

or again $$dFCS(x) = \text{Remainder} \left( x^{16} \cdot \sum_{i=n}^{p-1} (b_i - a_i) x^i, G(x) \right)$$

dFCS(x) represents what is to be added to the $FCS_r$ to get $FCS_t$.

For instance, assuming that the frame contained 80 bytes (k=640 bits) and that the first 20 bytes (n=480 bits, p=640 bits) are modified, dFCS will be equal to:

$$dFCS(x) = \text{Remainder} \left( x^{16} \cdot \sum_{i=480}^{639} (b_i - a_i) x^i, G(x) \right)$$

and can be computed as follows:
1) compute (by XOR) the bit string:

$$b_{639} - a_{639}, \ldots, b_{480} - a_{480}$$

2) compute dFCS, i.e. the partial FCS of this bit string, as any other normal FCS,
3) add (by XOR) this dFCS to the original FCS, i.e. $FCS_r$ to get $FCS_t$.

Obviously the same reasoning also applies, should the modified portion consist of several parts embedded anywhere within the $P_{k-1}(x)$ frame.

Figure 4:
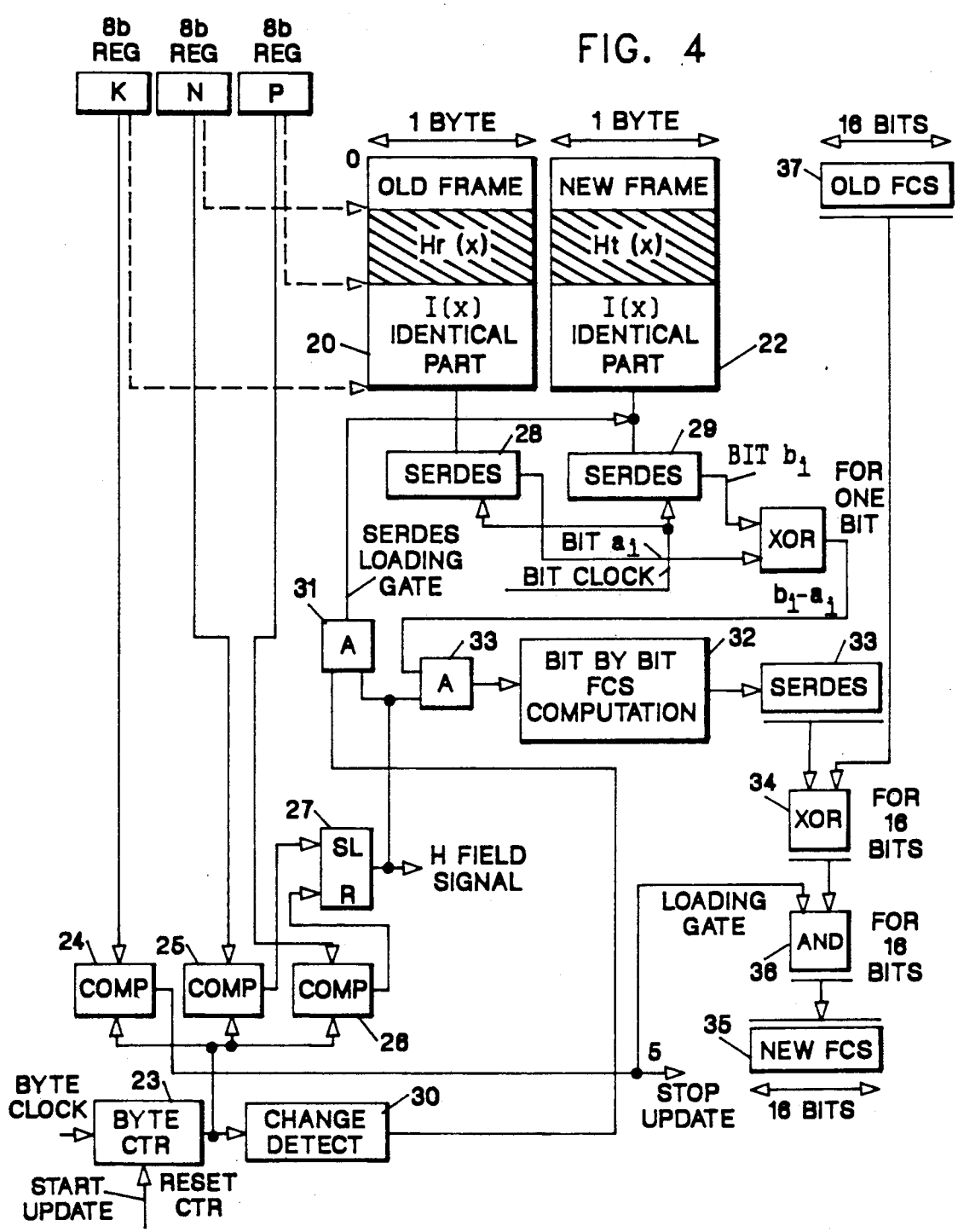
FIGS. 4, 5, 5a and 5b are devices for implementing the invention.

A device for implementing the above process operations is represented in FIG. 4.

The old and new frames are stored into storages 20 and 22 respectively. Both storages are loaded with the information data (i.e. I(x)) not normally subjected to variations throughout the process, and with the variable portions of the frames, i.e. $H_r(x)$ and $H_t(x)$ respectively.

Three one-byte long registers K, N and P are used to respectively store the last byte address of I(x) plus 1, the first byte address of H (i.e $H_r(x)$ and $H_t(x)$) and the last byte address of H(x) plus 1.

A byte counter 23, controlled by a clock, is incremented, at a start update command, from zero to K bytes for a K-bytes long frame. The byte count of counter 23 is permanently compared in comparators 24, 25 and 26 to K, N and P. Since the modified byte starts at the $n^{th}$ byte and ends at the $(p-1)^{th}$ byte, the outputs of comparators 25 and 26 are respectively used to set and reset a latch 27 whose output signal represents the H field length. During the modified H field period (H field signal=1), the scanned bytes are transferred into serializers SERDES 28 and 29, at a byte rate thanks to a circuit 30 detecting a byte count change in counter 23 gated through AND gate A31 controlled by the H field signal.

Once a byte is transferred into each SERDES 28 and 29, the contents thereof are shifted at bit clock rate into a XOR circuit performing the $b_i - a_i$ operations. Said $b_i - a_i$ is fed into an FCS computation device 32 through AND gate A33 controlled by the H field signal. The FCS bits are fed into a 16 bits long deserializer SERDES 33.

For the byte counter 23 counting from zero to the $(N-1)^{th}$ byte and from P to $K^{th}$ byte, the H field period zeros (H field signal=0) are fed into the bit by bit FCS computation device.

A sixteen bits long buffer 37 stores the old FCS (i.e. $FCS_r$) to be updated. Said $FCS_r$ is XORed in a sixteen-bits long XOR device 34 also connected to the parallel output of SERDES 33.

Once the $K^{th}$ byte count is detected by compare circuit 24 the FCS updating is stopped and new FCS gated into a 16 bits buffer 35 through 16-bits long AND gate 36.

Another particularly interesting implementation of this invention could be achieved, assuming for instance a two-byte long header be located at a predetermined location within the frame. Noting however that for a one byte long header the method applies by filling the highest order byte of the two bytes long header with zeros.

Figure 3B:
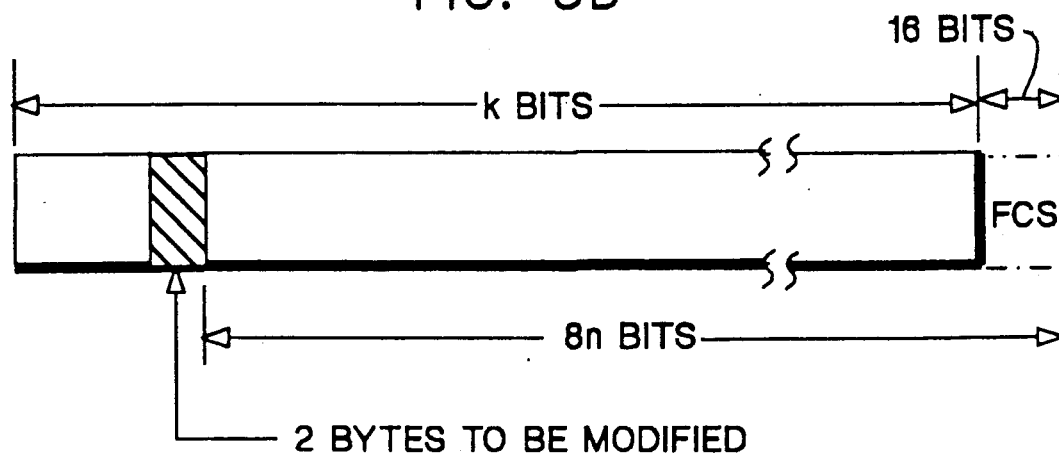

Represented in FIG. 3b is a frame being K-bits long without the FCS which can be considered as divided into three parts, with the 2 bytes to be modified (header) being embedded within the frame at the $n$-$th$ byte position including the FCS. Assuming the old value of the header be represented by a polynomial $O(x)$, and its new value be represented by a polynomial $N(x)$, both $O(x)$ and $N(x)$ being of polynomial degree 15 at most then one may define the difference polynomial $$D'(x) = N(x) - O(x)$$

The correlative modification to the overall FCS is:

$$dFCS(x) = \text{Remainder}(D'(x) \cdot x^{8n}, G(x))$$

or $$dFCS(x) = \{\text{Remainder}(D'(x), G(x)) \text{ multiplied by Remainder}(x^{8n}, G(x))\} \text{ modulo } G(x)$$

Since, assuming two polynomials $$P_1(x) = Q_1(x) \cdot G(x) + R1(x)$$
and
$$P_2(x) = Q_2(x) \cdot G(x) + R2(x)$$

then:

$$\text{Remainder}(P_1(x) \cdot P_2(x), G(x))) = \text{Remainder}(R_1(x) \cdot R_2(x), G(x))$$

It should be noted that $D'(x)$ is its own remainder, since the header being two bytes long, $D'(x)$ contains at most 16 significant bits. Therefore, the computation of equation $dFCS(x)$ requires only computing the Remainder of $x^{8n}$, to be referred to as $R_b(x)$.

All possible values of this last Remainder have to be computed for "n" taking any value from 1 to 16,000, since frames used in satellite communication network may include up to 16,000 bytes.

Noting that n could be written in its binary form as:

$$n = \sum_{i=0}^{m} n_i \cdot 2^i$$

with m being the highest bit weight of n, and $n_i = 0$ or 1.

$$R_b = \text{Remainder}(x^{8n}, G(x)))$$
$$= \text{Remainder}\left(\prod_{i=0}^{m} (x^{8 \cdot n_i \cdot 2^i}, G(x)) \text{ for } i = 0 \text{ to } m\right)$$
$$= \prod_{\substack{i=0 \\ n_i=1}}^{m} (\text{Remainder}(x^{8 \cdot 2^i}, G(x))) \text{ modulo } G(x)$$

Therefore $R_b$ could be written:

$$R_b = \prod_{\substack{i=0 \\ n_i=1}}^{m} R_i(x)$$

Wherein $R_i(x)$ might be designated as "bit Remainder":

$$R_i(x) = \text{Remainder}(R^{8 \cdot 2^i}, G(x))$$

and $\pi$ stands for "product of . . ."

Then $$dFCS = (D'(x)) \cdot \prod_{\substack{i=0 \\ n_i=1}}^{m} R_i(x) \text{ modulo } G(x)$$
$$= D'(x) \cdot R_0(x) \cdot R_1(x) \ldots \text{ for all } i \text{ such that } n_i = 1$$
$$\text{modulo } G(x)$$

For example, assuming the bytes to be modified within the considered frame be located at the n=245th position, $$\text{then: } n = 245 = 128 + 64 + 32 + 16 + 4 + 1$$
$$= 2^7 + 2^6 + 2^5 + 2^4 + 2^2 + 2^0$$

or
$$n = n_7 \cdot 2^7 + n_6 \cdot 2^6 + n_5 \cdot 2^5 + n_4 \cdot 2^4 + n_3 \cdot 2^3 + n_2 \cdot 2^2 + n_1 \cdot 2^1 + n_0 \cdot 2^0$$
with
$n_i = 0$ for $i = 1$ and 3
and
$n_i = 1$ for $= 0, 2, 4, 5, 6$ and 7.
In this case:

$$R_b = \text{Product}(\text{Remainder}(x^{8 \cdot 2^i}, G(x))) \text{ modulo } G(x)$$
$$\text{for } i = 0,2,4,5,6,7.$$

The Remainders otherwise referred to as bit-Remainders "$R_b$" might be prestored.

Assuming the bytes to be modified within the considered frame could be located anywhere up to the n=255$^{th}$ position, the highest number of Remainders to be considered could be equal to eight. And for n up to n=16383, there would be a maximum of 15 Remainders only to be considered. These Remainders are represented in the following TABLE of REMAINDERS.

TABLE of REMAINDERS

| i | Remainder polynomial Ri (x) | Remainder Bits |
|---|---|---|
| 0 | $X^8$ | 0000 0001 0000 0000 = x"0100" |
| 1 | $X^{12}+X^5+1$ | 0001 0000 0010 0001 = x"1021" |
| 2 | $X^{13}+X^{12}+X^{10}X^9+X^8+X^5+X^4$ | 0011 0111 0011 0000 = x"3730" |
| 3 | $X^{15}+X^{13}+X^{12}+X^{11}+X^6+X^5+1$ | 0011 1000 0110 0001 = x"3861" |
| 4 | $X^{15}+X^{13}+X^{11}+X^{10}+X^9+X^7+X^6+X^5+X^4+X^3+X^2$ | 1010 1110 1111 1100 = x"AEFC" |
| 5 | $X^{15}+X^{11}+X^{10}+X^9+X^5+X^3+1$ | 1000 1110 0010 1001 = x"8E29" |
| 6 | $X^{12}+X^9+X^8+X^7+X^6+X^5+X^4+X^3+X^2$ | 0001 0011 1111 1100 = x"13FC" |
| 7 | $X^{13}+X^{12}X^{10}X^9+X^7+X^6+X^2$ | 0011 0110 1100 0100 = x"36C4" |
| 8 | $X^{15}+X^{14}+X^{13}+X^{12}+X^{11}+X^{10}+X^8+X^6+X^4$ | 1111 1101 0101 0000 = x"FD50" |
| 9 | $X^{15}+X^{13}+X^{11}+X^9+X^7+X^4+X^3+X^2+X$ | 1010 1010 1001 1110 = x"AA9E" |
| 10 | $X^{15}+X^{11}+X^4+X^3+X^2$ | 1000 1000 0001 1100 = x"881C" |
| 11 | $X^{14}+X^{10}+X^6+X^4+X^3$ | 0100 0100 0101 1000 = x"4458" |
| 12 | $X$ | 0000 0000 0000 0010 = x"0002" |
| 13 | $X^2$ | 0000 0000 0000 0100 = x"0004" |
| 14 | $X^4$ | 0000 0000 0001 0000 = x"0010" |
| 15 | $X^8$ | 0000 0001 0000 0000 = x"0100" |

These Remainders might be stored into a Random Access Memory (RAM), and then the whole FCS recomputation process would involve:

computing $D'(x)=N(x)-O(x)$ with $N(x)$ and $O(x)$ being the new and old headers respectively loading the effective $$n = \sum_{i=0}^{m} n_i \cdot 2^i$$

into an address register, addressing said RAM at each i address for which $n_i=1$;

taking the product $R_b$ of the fetched remainders;

multiplying Rb by D(x) to derive dFCS therefrom; and, adding dFCS to the old FCS.

Figure 5A:
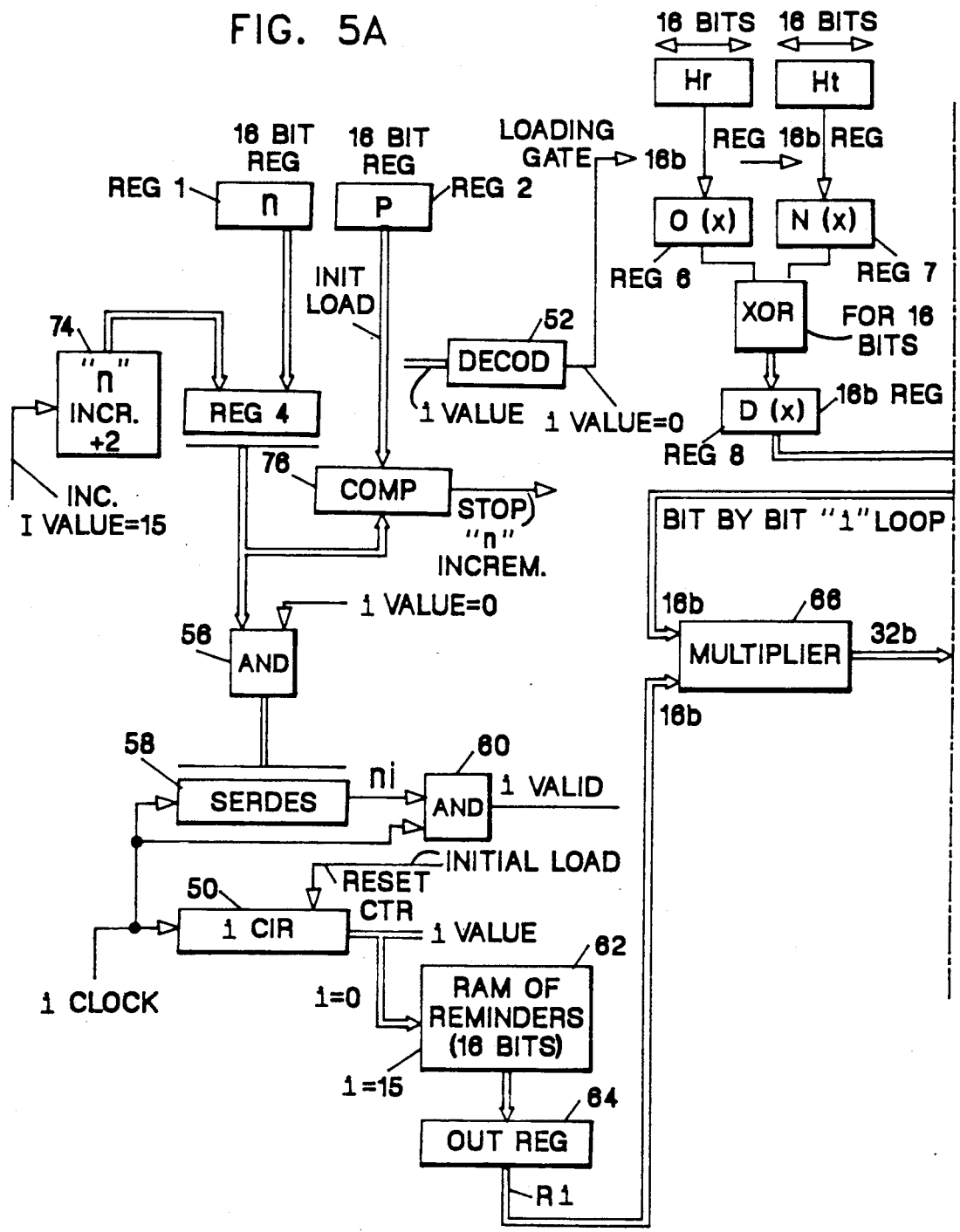
Figure 5:
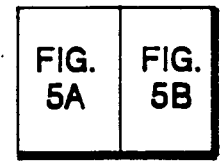
Figure 5B:
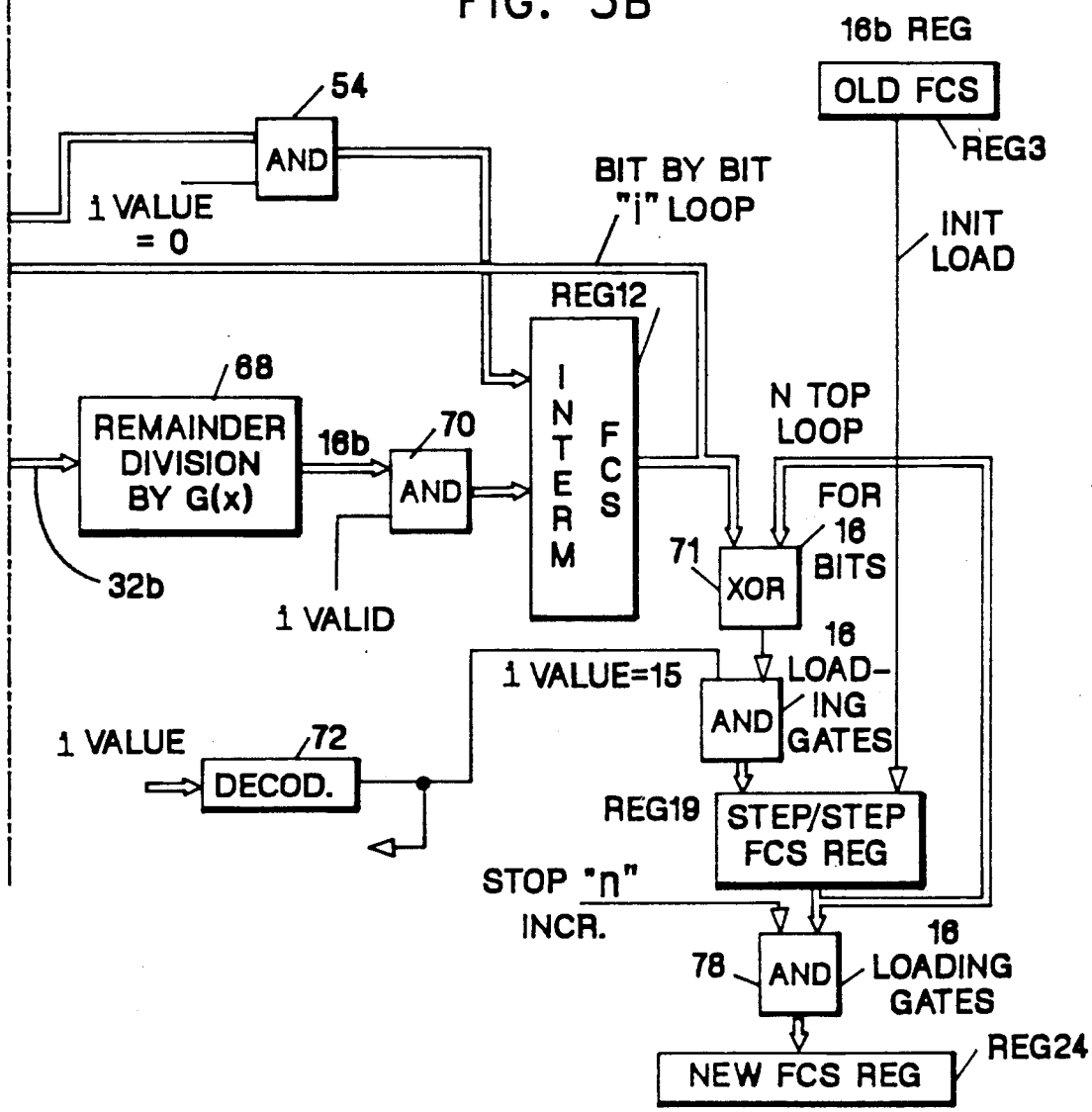

Represented in FIG. 5 is an implementation of the device made to perform the FCS updating using prestored Remainders according to the above table.

The device is made to update the FCS in the case wherein the bytes in the considered frame are modified between byte position n and byte position (p−1), with $n \leq p-1$.

The values n an p are stored into 16-bit long registers Reg 1 and Reg 2 respectively. The old part of the frame between bytes n and p−1 is stored into a storage $H_r$ and the modified part or new section between bytes n and p−1 is stored into $H_t$. The old FCS is stored into a register Reg 3.

The operation starts with an "Initial load" signal, which transfers n from Reg 1 to a register Reg 4, the old FCS from Reg 3 to a register Reg 19 ("step/step FCS"), and resets a counter 50 to zero. This counter 50 operates modulo 16, i.e. when incremented beyond 15, it resets to zero. A decoder 52, detecting "i value=0", transfers the first two bytes from $H_r$ and $H_t$ into registers Reg 6 and Reg 7 respectively. These two 2 bytes long words are XORed and transferred into register Reg8 which then contains $D'(x)=N(x)-O(x)$. The contents of register Reg 8 is transferred to an "Intermediate FCS" register Reg 12 via an AND gate 54 controlled by "i value=0" signal.

At i=0, the contents of register Reg 4 is unloaded, through AND gate 56, into a serializer (SERDES) 58, the output of which drives an AND gate 60. The SERDES 58 shifting operations are controlled by "i clock" signal defining i rate. The i clock also controls the incrementation of counter 50, and the second input of AND gate 60 as well. The coincidence of an "i clock" pulse with a binary value 1 at the output of SERDES 58 generates an up level (i.e. "i valid") indication at the output of gate 60.

The contents of counter 50 is used to address a storage (RAM) 62 containing the remainders as defined in the TABLE OF REMAINDERS for i=0 to 15. Said table is thus scanned cyclically and the addressed contents are cyclically transferred into an output register 64 Concurrently, at i clock rate, the contents of registers 64 and reg 12 are multiplied together (polynomial multiplication) in a multiplier 66. The multiplier output i.e 32 bit long polynomial, is fed into a device 68 providing a 16-bit long polynomial representing the remainder of polynomial division by G(x) of said multiplier output. Said remainder is transferred into intermediate FCS Reg 12, through an AND gate 70, if and only if the "i valid" indication is up. When i had reached the value 15, reg 12 contains the dFCS value.

The contents of reg 12 and Reg 19 are XORed through 16-bit XOR 71, the result of which is fed back into Reg 19 when i=15 is detected by DECODER 72.

The i value=15 signal provided by DECODER 72, triggers an incrementer 74 which increments by 2 the contents of register Reg 4. A comparator 76 compares the new value of Reg 4 contents with Reg 2 contents and when they are equal, generates a "stop n increment" indication which triggers, through AND gate 78 the new FCS frame from Reg 19 to Reg 24.

Should the header variation be longer than 2 bytes long the process is repeated. It should be noted that n and p have been supposed to be multiples of 2 bytes. For n and p multiples of one bytes, a zero pattern is loaded in corresponding 8 bit positions in $H_r$ and $H_t$ registers.

The above described invention suits particularly well to Communication Controllers applications wherein each received message is conventionally first assembled, checked for valid ($FCS_r$), then stored without $FCS_r$ until it being forwarded toward its destination possibly through other Communication Controllers. Prior to this forwarding, a new FCS (i.e. $FCS_t$) needs to be computed and associated to the outgoing frame. As will be apparent from the following description on an implementation, the invention not only reduces the computing load required, but, in addition, enables checking at the receiving location, the validity of the whole received frame and thus detecting any alteration of the data stored in the Communication Controller(s) the data went through.

Figure 6:
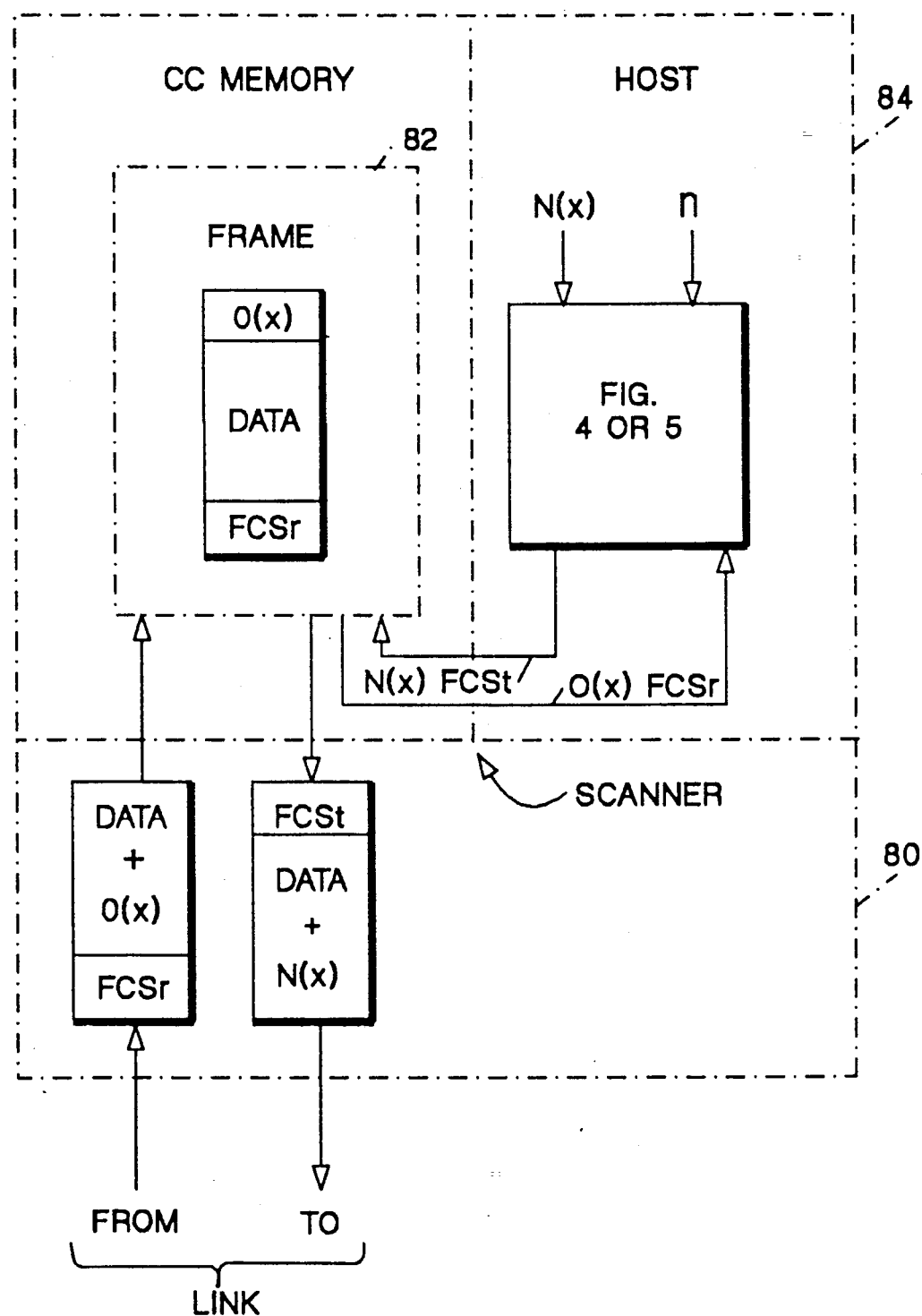
FIG. 6 shows an application of the invention.

Represented in FIG. 6 is a schematic block diagram of the invention implemented in a Communications Controller. The Controller elements involved in this invention include a scanner 80, a Communication Controller (CC) Memory 82, and a Host 84. Incoming and outgoing communication links are attached to the scanner 80, which scans said incoming link to detect the received bits and assembles them into SDLC/HDLC message frames. The received message includes data, header O(x), $FCS_r$ and flags, with the header designating here the portion of HDLC/SDLC message subject to being modified for frame routing purposes. The flags being removed as soon as the frame is assembled have not been represented in the figure. Each received frame is stored in a Memory 82 location assigned to the link involved, by the Host 84, prior to it being forwarded onto the appropriate outgoing link under the Host control. The Host need not only designate the outgoing link, but also reconstruct the HDLC/SDLC frame with flags, data, new header (N(x)) and new FCS ($FCS_t$) The new header is determined by the host to include new routing information e.g. identification of next node on the communication network. The new FCS is computed within the Host. The Host is aware of the location (n) of the header byte to be modified, as well as of its new contents N(x). It also knows the CC Memory location considered and fetches therefrom $FCS_r$ and O(x) to generate the new FCS (i.e. $FCS_t$) to be assigned to the outgoing frame. The $FCS_t$ generation is operated using a device as represented in FIG. 4 or 5.

Obviously, the method may be extended to a header of any length by repeating the process.

What is claimed is:

1. A process for updating the frame checking sequence (FCS) of a data frame including a polynomial information section I(x), a polynomial header section $H_r(x)$ and the FCS corresponding to the Remainder of the polynomial division of $I(x)+H_r(x)$ by a predetermined polynomial generator G(x), with the operations being performed in the Galois field, said process including:

partitioning the frame into the polynomial header section $H_r(x)$ to be varied into $H_t(x)$ and the polynomial information section I(x) to be kept unchanged;

computing a difference or variation polynomial D(x) over header sections $H_r(x)$ and $H_t(x)$ only.

$$D(x) = H_t(x) - H_r(x);$$

computing a differential FCS dFCS(x) = Remainder $|D(x) x^{16}, G(x))$; and adding the differential FCS to an original $FCS_r(x)$ to generate an updated FCS, (i.e. FCS).

2. A process according to claim 1 wherein said differential FCS is computed on a bit-by-bit basis over said difference polynomial D(x).

3. A process for updating the frame checking sequence (FCS) of a data frame including a polynomial information section I(x) to be kept unchanged, a polynomial header section $H_r(x)$ being a two bytes long word starting at the $n^{th}$ byte position of said data frame (including FCS), to be varied into $H_t(x)$ and the FCS corresponding to the Remainder of the polynomial division of $I(x)+H_r(x)$ by a predetermined polynomial generator G(x), with the operations being performed in the Galois field, said process including:

computing a difference or variation polynomial, $$D(x) = H_t(x) - H_r(x);$$

computing a differential FCS (dFCS(x)), with said dFCS(x) further including computing the Remainder R(x) of the polynomial division of $x^{8n}$ by G(x);

multiplying said Remainder R(x) by D'(x); wherein D'(x) is the polynomial such that $D(x) = D'(x) \times x^{8 \times n - 16}$; and adding the differential FCS to the original $FCS_r(x)$ to generate the updated FCS, (i.e. $FCS_t$).

4. A process according to claim 3 wherein said $n^{th}$ byte location is expressed in its binary form $$n = \sum_{i=0}^{m} n_i \times 2^i$$

with $n_i = 0$ or 1 and m being the highest bit weight of n; and said differential FCS computing operation includes:

computing "bit Remainders" of the polynomial division of $x^{8 \times 2^i}$ by G(x) for each value of i=0 to m for which $n_i = 1$;

multiplying said bit Remainders together; and, multiplying by D'(x) said multiplied bit Remainders.

5. A process according to claim 4 wherein said "bit" Remainders are precomputed and stored.

6. A device for updating into $FCS_t$ the frame checking sequence ($FCS_r$) of a data frame including a variable header, to be varied from an O(x) polynomial into a N(x) polynomial located at the $n^{th}$ byte position of the frame, said updating using a polynomial generator G(x), said device including:

first XOR means for performing $D'(x) = N(x) \oplus O(x)$ storage means storing so called bit Remainders representing the remainders of predetermined values of $x^{8 \times i}$ by G(x);

addressing means for addressing said storage means;

means for storing into said addressing means a binary expression of $$n = \sum_{i=0}^{m} n_i \times 2^i$$

and fetching sequentially from said storage means said bit-Remainders for each storage location corresponding to $n_i = 1$;

First multiplier means connected to said storage means for multiplying said fetched bit Remainders with each other;

second multiplier means connected to said first multiplier means and to said XOR means providing D'(x); and, adding means connected to said second multiplier means for adding said second multiplier output to said $FCS_r$ and derive $FCS_t$ therefrom.

7. A device for updating into $FCS_t$ the frame checking sequence ($FCS_r$) of a data frame including a variable header, to be varied from an O(x) polynomial into a N(x) polynomial located at the nth byte position of the frame, said updating using a polynomial generator G(x), said device including:

first XOR means for performing $D'(x) = N(x) \text{ (XOR)} O(x)$ storage means storing so called bit Remainders representing the remainders of predetermined values of $x^{8 \cdot 2^i}$ by G(x);

addressing means for addressing said storage means;

means for storing into said addressing means a binary expression of $$\sum_{i=0}^{m} n_i \times 2$$

and fetching sequentially from said storage means said bit Remainders for each storage location corresponding to $n_i = 1$;

first multiplier means connected to said storage means for multiplying said fetched bit Remainders with each other;

second multiplier means connected to said first multiplier means and to said XOR means providing $D'(x)$; and adding means connected to said second multiplier means for adding said second multiplier output to said $FCS_r$ and derive $FCS_t$ therefrom.

* * * * *